United States Patent
Shabbir et al.

(10) Patent No.: US 9,952,639 B2
(45) Date of Patent: Apr. 24, 2018

(54) SYSTEM AND METHOD FOR PROVIDING COOLING SUPPORT OF CARDS IN AN INFORMATION HANDLING SYSTEM

(71) Applicant: Dell Products, LP, Round Rock, TX (US)

(72) Inventors: Hasnain Shabbir, Round Rock, TX (US); Dominick A. Lovicott, Round Rock, TX (US); Dinesh K. Ragupathi, Round Rock, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 399 days.

(21) Appl. No.: 14/671,573

(22) Filed: Mar. 27, 2015

(65) Prior Publication Data

US 2016/0282916 A1 Sep. 29, 2016

(51) Int. Cl.
| | | |
|---|---|---|
| G05D 17/00 | (2006.01) |
| G05D 23/00 | (2006.01) |
| H05K 5/00 | (2006.01) |
| G01K 17/00 | (2006.01) |
| G01P 3/00 | (2006.01) |
| G06F 1/20 | (2006.01) |
| H05K 7/20 | (2006.01) |

(52) U.S. Cl.
CPC ......... *G06F 1/206* (2013.01); *H05K 7/20209* (2013.01); *H05K 7/20836* (2013.01); *Y02B 60/1275* (2013.01)

(58) Field of Classification Search
CPC ............... G06F 1/206; H05K 7/20836; H05K 7/20209; Y02B 60/1275
USPC ........ 726/20, 27; 361/679.48, 695; 702/136, 702/145; 700/299, 278
See application file for complete search history.

(56) References Cited

U.S. PATENT DOCUMENTS

| | | | |
|---|---|---|---|
| 5,829,515 A | 11/1998 | Jeffries et al. | |
| 5,862,037 A * | 1/1999 | Behl ....................... | F04D 25/08 361/679.48 |
| 8,405,985 B1 * | 3/2013 | Reynov ............... | H05K 7/20736 361/688 |
| 8,812,831 B2 * | 8/2014 | Cheng ..................... | G06F 1/206 713/2 |
| 2004/0098269 A1 | 5/2004 | Wise et al. | |
| 2004/0153786 A1 * | 8/2004 | Johnson ................... | G06F 1/26 714/25 |
| 2012/0084551 A1 * | 4/2012 | Cheng ..................... | G06F 1/206 713/2 |
| 2013/0018523 A1 * | 1/2013 | Rubenstein ........ | G05D 23/1919 700/300 |
| 2015/0052389 A1 * | 2/2015 | Swanson ............. | G06F 11/2023 714/11 |

(Continued)

*Primary Examiner* — Robert Fennema
*Assistant Examiner* — Thomas Stevens

(57) ABSTRACT

An information handling system includes a fan controller, and a controller. The fan controller controls a speed of a cooling fan. The controller detects a presence of a card within the information handling system, determines whether the card matches a first thermal control method of a plurality of thermal control methods, utilizes the first thermal control method to cool the card in response to the card matching the first thermal control method, otherwise determines whether the card matches a next in order thermal control method of the thermal control methods.

19 Claims, 4 Drawing Sheets

(56) References Cited

U.S. PATENT DOCUMENTS

2015/0066595 A1    3/2015  Naseh et al.
2016/0183406 A1\*  6/2016  Ragupathi .......... H05K 7/20209
                                                  700/282

\* cited by examiner

SYSTEM AND METHOD FOR PROVIDING COOLING SUPPORT OF CARDS IN AN INFORMATION HANDLING SYSTEM

FIELD OF THE DISCLOSURE

The present disclosure generally relates to system and method for providing cooling support of cards in an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination. An information handling system can include a cooling fan to cool cards within the information handling system based on an inlet ambient temperature of the information handling system.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

Figure 1:
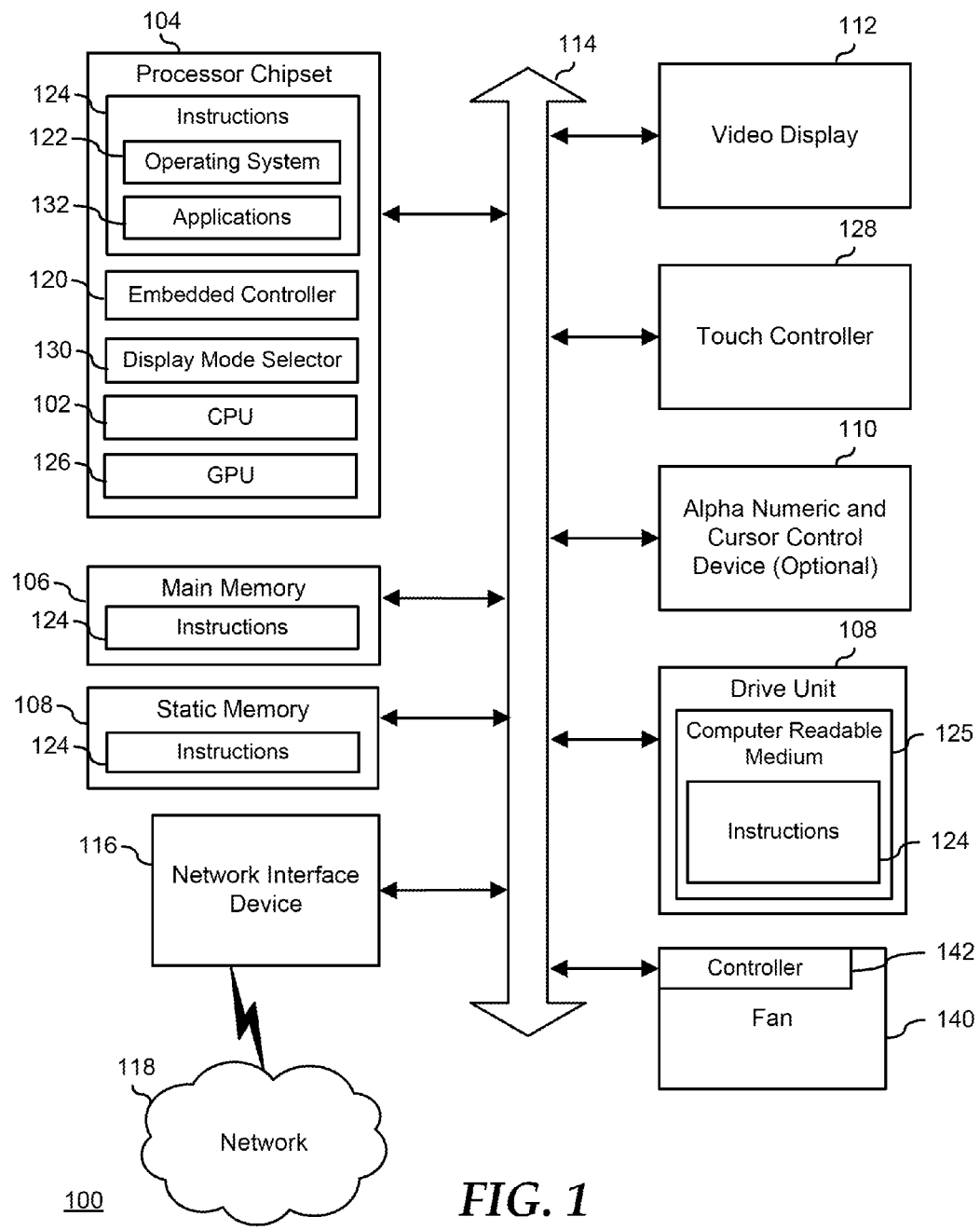
FIG. 1 is a block diagram of an information handling system according to at least one embodiment of the present disclosure.

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings may be utilized in this application, as well as in other applications and with several different types of architectures such as distributed computing architectures, client or server architectures, or middleware server architectures and associated components.

For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer, such as desktop or laptop, tablet computer, mobile device (e.g., personal digital assistant (PDA) or smart phone), server (such as blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

In an embodiment, an information handling system includes a controller, a fan controller, a cooling fan, and one or more cards. When a new card is inserted into the information handling system the controller can perform a hierarchical process to determine whether the card matches one of a number of thermal control methods. In an embodiment, the thermal control methods can include a thermal table, a custom field replaceable unit (FRU) of the card, a portfolio table, and industry table cooling tier register, or the like.

If the card matches one of the thermal control methods, the controller can determine a cooling tier level for the card, such as cooling tier level 1, 2, 3, or 4, and can provide the fan controller with a fan speed control setting for the cooling fan based on the cooling tier level. In an embodiment, if the card does not match one of the thermal control methods, such that an unmatched response is received at the controller, the controller can then calculate a fan speed setting for the cooling fan based on an estimated power consumption of the card. The controller can also display a message to an individual of the information handling system in response to the unmatched response. In an embodiment, the displayed message can indicate that an unmatched card has been detected, and that an estimated fan speed has been determined and applied. The individual can then turn off the unmatched response process if the individual would like to provide his or her own fan speed settings.

FIG. 1 shows an information handling system 100 including conventional information handling systems components of a type typically found in client/server computing environments. The information handling system 100 may include memory, one or more processing resources such as a central processing unit (CPU) 102 and related chipset(s) 104 or hardware or software control logic. Additional components of system 100 may include main memory 106, one or more storage devices such as static memory or disk drives 108, an optional external input device 110 such as a keyboard, and a cursor control device such as a mouse, or a video display 112. The information handling system 100 may also include one or more buses 114 operable to transmit communications between the various hardware components.

More specifically, system 100 represents a mobile user/client device, such as a dual screen mobile tablet computer. System 100 has a network interface device 116, such as for a wireless cellular or mobile networks (CDMA, TDMA, or the like), WIFI, WLAN, LAN, or similar network connection, enabling a user to communicate via a wired or wireless communications network 118, such as the Internet. System 100 may be configured with conventional web browser software. The web browser, may include for example Microsoft Corporation's Internet Explorer web browser software, Firefox or similar such browsers to allow the user to interact with websites via the wireless communications network 118.

System 100 may include a several sets of instructions 124 to be run by CPU 102 and any embedded controllers 120 on system 100. The instructions 124 can be stored in a computer readable medium 125 of a drive unit 108. One such set of instructions includes an operating system 122 with operating system interface. Additional sets of instructions in the form of multiple software applications 124 may be run by system 100. These software applications 124 may enable multiple uses of the dual display information handling system as set forth in more detail below.

System 100 includes a display screen 112. The display screen 112 has a display driver operated by one or more graphics processing units (GPUs) 126 such as those that are part of the chipset 104. The display screen 112 also has an associated touch controller 128 to accept touch input on the touch interface of the display screen.

The display screen 112 may also be controlled by the embedded controller 120 of chipset 108. Each GPU 126 and display driver is responsible for rendering graphics such as software application windows and virtual tools such as virtual keyboards on the display 112. Control of the location and positioning of these windows may be set by user input to locate the screens or by control setting default. In several embodiments described herein, control of the location for rendering for software application windows and virtual tools in the display may be determined by an application window locator system as described further in the embodiments herein. The application window locator system determines operating state rank of running software applications and determines whether and where to display application display windows and virtual tools based on relative orientation and state of usage information. Windows may include other forms of display interface with software application besides a window. It is contemplated that tiles, thumbnails, and other visual application access and viewing methods via a display are contemplated to be considered windows. Virtual tools may include virtual keyboard, virtual touchpad or controller, virtual buttons and other input devices rendered via a display screen and accepting feedback via a touch control system.

In another example of display control via the disclosures herein, the power to the display screen 112 is controlled by an embedded controller 120 in the processor chipset(s) which manages a battery management unit (BMU) as part of a power management unit (PMU) in the BIOS/firmware of the main CPU processor chipset(s). These controls form a part of the power operating system. The PMU (and BMU) control power provision to the display screen and other components of the dual display information handling system.

A display mode selector 130, in connection with an application window locator system as described in more detail below, determines priority of concurrently running software applications and how to automatically locate software application display windows and virtual tools on the screen via the chipset 104 based upon orientation of the display screen 112 as well as the software applications 132 currently running and active and their status. Determining which applications 132 are running determines a working software application context. Alternatively, the application window locator may operate on an embedded controller 120 separate from the main CPU chipset(s) 104. Additionally, the power management application may receive state of usage activity input from device state sensors.

In an embodiment, the information handling system 100 includes a cooling fan 140 and fan controller 142. In different embodiments, the fan controller 142 can be incorporated within the cooling fan 140, as shown in FIG. 1, or can be a separate component within the information handling system 100. The fan controller 142 can communicate with another controller of the information handling system 100, such as baseboard management controller, the embedded controller 120, or the like, to determine whether a card has been inserted into the information handling system. In an embodiment, the card can be a peripheral component interconnect express (PCIe) card or the like. When a new card is inserted into the information handling system 100 the controller of the information handling system can perform a hierarchical process to determine whether the card matches one of a number of thermal control methods. In an embodiment, the thermal control methods can include a thermal table, a custom field replaceable unit (FRU) of the card, a portfolio table, and industry table cooling tier register, or the like.

If the card matches one of the thermal control methods, the controller of the information handling system 100 can determine a cooling tier level for the card, such as cooling tier level 1, 2, 3, or 4, and can provide the fan controller 142 with a fan speed setting for the cooling fan 140 based on the cooling tier level. In an embodiment, if the card does not match one of the thermal control methods, such that an unmatched response is received at the controller, the controller can then calculate a fan speed setting for the cooling fan 140 based on an estimated power consumption of the card. The controller can also display a message to an individual of the information handling system 100 in response to the unmatched response. In an embodiment, the displayed message can indicate that an unmatched card has been detected, and that an estimated fan speed has been determined and applied. The individual can then turn off the unmatched response process if the individual would like to provide his or her own fan speed settings.

Figure 2:
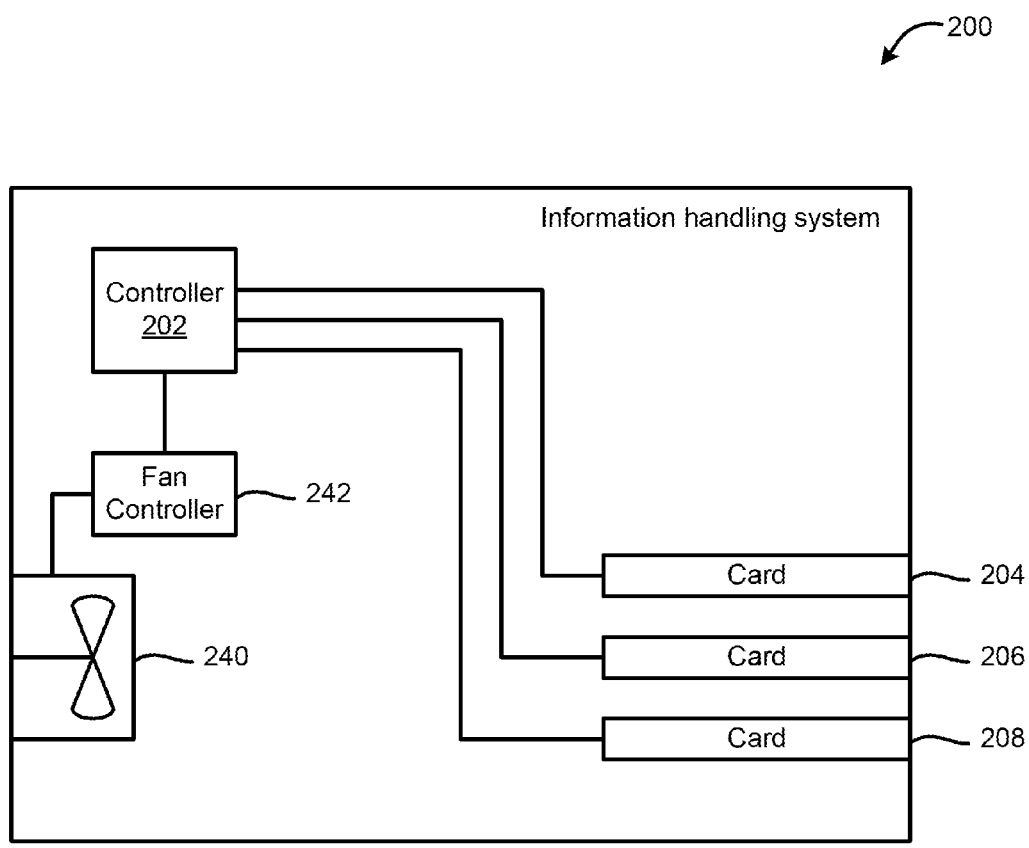
FIG. 2 is a block diagram of a portion of the information handling system including a cooling fan and cards according to at least one embodiment of the present disclosure.

FIG. 2 illustrates an information handling system 200 including a controller 202, multiple cards 204, 206, and 208, a cooling fan 240, and a fan controller 242 according to at least one embodiment of the present disclosure. The controller 202 can communicate with the cards 204, 206, and 208, and with the fan controller 242, which in turn can communicate with the cooling fan 240. In an embodiment, the controller 202 can be a baseboard management controller, an embedded controller, or any similar controller that can enable communication to the information handling system including an integrated Dell Remote Access Controller (iDRAC). The controller 202 can detect whether the cards 204, 206, and 208 are inserted or removed from within the information handling system 200. In an embodiment, the cards can be a peripheral component interconnect express (PCIe) cards or the like.

When a new card, such as card 204, is inserted into the information handling system 200, the controller 202 can detect the card and can retrieve an identifier of the card. In an embodiment, the identifier for the card 204 can be a vender identification number, a sub-vendor identification number, a device identification number, a sub-device identification number, or the like. The controller 202 can then perform a hierarchical process to determine whether the identifier of the card matches one of a number of thermal cooling methods. In an embodiment, the controller 202 can compare the identifier of the card to each of the thermal cooling methods in the same order each time a new card is inserted. For example, in response to card 204 being inserted in the information handling system 200, the controller 202 can first determine whether the card identifier matches a thermal table cooling method, and if the card identifier does not match the thermal table cooling method, the controller can determine whether the card identifier matches a custom field replaceable unit (FRU) cooling method. The next thermal cooling method in the hierarchical process is to determine whether the card identifier matches a portfolio table, and the last thermal cooling method is to determine whether the card 204 includes industry table cooling tier register. In an embodiment, if the card identifier does not match any of the thermal cooling methods, the controller 202 can calculate an estimated fan speed for the card 204, an individual can set a custom fan speed, or the like.

In an embodiment, the hierarchical process can be performed substantially the same for each of the cards 204, 206, and 208. However, for clarity and brevity, the hierarchical process will only be discussed with respect to card 204. When the controller 202 detects the card 204 and retrieves the identifier for the card, the controller can begin the hierarchical process by determining whether the identifier of the card matches one of the identifiers found in a platform thermal table of the information handling system 200. In an embodiment, the platform thermal table can be stored in a memory associated with the controller, such as a non-volatile memory, one of the memories 108 in FIG. 1, or the like.

If the identifier of the card 204 matches an identifier in the platform thermal table, the controller 202 can then determine a cooling tier for the card based on the platform thermal table. In an embodiment, the platform thermal table can include one or more cooling tiers, such as tier 1, tier 2, tier 3, tier 4, and tier 5. In an embodiment, the platform thermal table can be stored in the firmware of the controller and can group different card identifiers into different cooling tiers based on a predefined cooling need for the card. In an embodiment, the different cooling tiers can have different fan speeds based on the ambient temperature as shown in FIG. 3.

Figure 3:
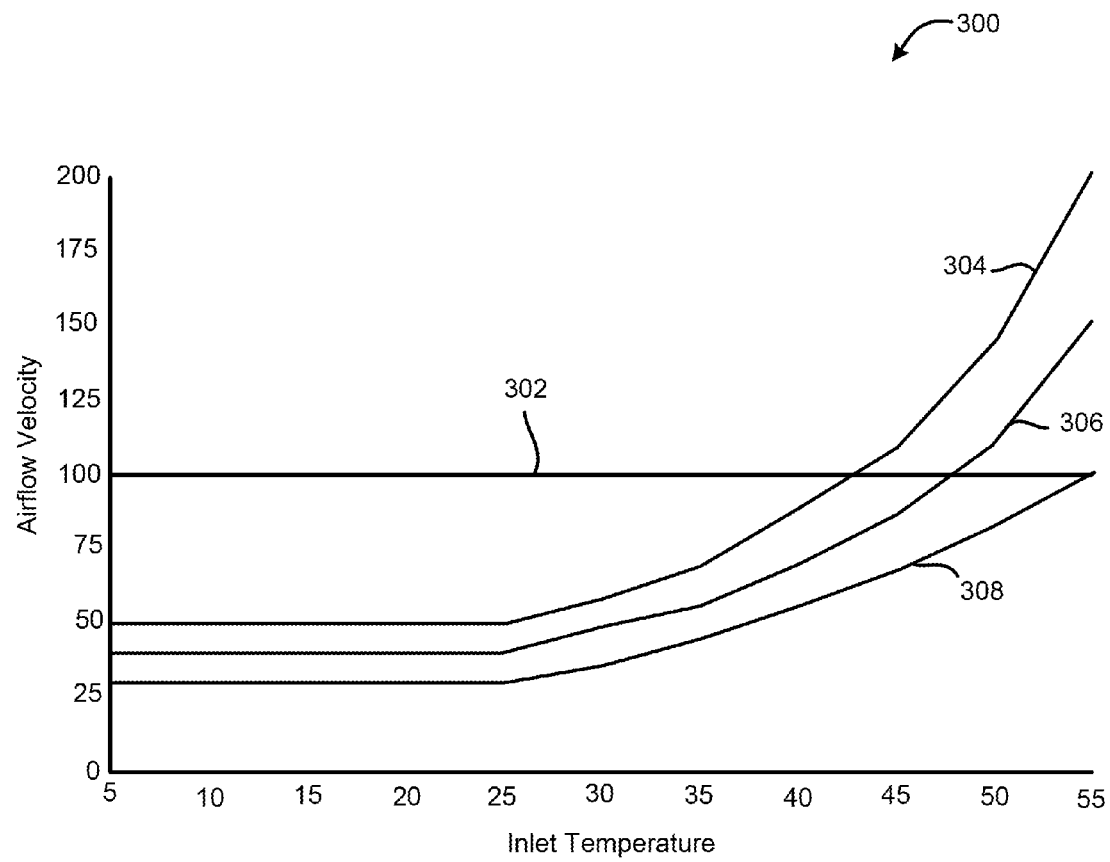
FIG. 3 is a graph representing cooling fan speeds of cooling tiers at different ambient temperatures of the information handling system according to at least one embodiment of the present disclosure.

FIG. 3 illustrates a graph 300 representing cooling fan speeds of different cooling tiers 302, 304, 306, and 308 at different ambient temperatures of the information handling system according to at least one embodiment of the present disclosure. As illustrated in FIG. 3, a first cooling tier 302 has a constant fan speed for all inlet ambient temperatures. The other cooling tiers 304, 306, and 308 can have a lower starting fan speed to save power consumption of the information handling system 200, but can increase the fan speeds as the inlet ambient temperature increases as shown in FIG. 3.

Referring back to FIG. 2, the controller 202 can provide a cooling fan setting to the fan controller 242 based on a cooling tier that the identifier of card 204 is associated with in the platform thermal table. The fan controller 242 can then monitor the ambient inlet temperature of the information handling system 200 and can set a fan speed of the cooling fan 240 based on the cooling fan setting and the inlet ambient temperature.

If the controller 202 determines that the identifier of the card 204 does not match an identifier in the platform thermal table, the controller can then determine whether the card includes a custom FRU that includes a cooling tier for the card. In an embodiment, the FRU of the card can be stored in a local memory of the card 204 and can be accessible by the controller 202. If the card includes a custom FRU, the controller 202 can determine a fan speed control setting based on the cooling tier in the custom FRU. In an embodiment, the FRU of the card can also be utilized with respect to a closed loop thermal control. In this embodiment, a temperature from the detected card can be read by the controller 202, and the controller can alter the closed loop thermal control to provide a fan speed control setting that can maintain the temperature of the card 204 at a target temperature defined in the FRU or other applicable table of the card. The controller 202 can provide the fan speed control setting to the fan controller 242, which in turn can then set different the fan speeds of the cooling fan 240 based on the measured inlet ambient temperatures.

However, if the card 204 does not include a custom FRU that includes a cooling tier for the card, the controller 202 determines whether the identifier of the card matches any of the identifiers in a portfolio table. In an embodiment, the portfolio table can be stored within a memory of the controller 202, in a memory of the information handling system, such as memories 108 in FIG. 1, which is accessible by the controller, or the like. In an embodiment, the portfolio table can include a device cooling tier field, which includes a cooling tier for the card. If the identifier for the card is located within the portfolio table, the controller 202 can determine a fan speed control setting based on the cooling tier associated with the card within the portfolio table, and can provide the fan speed control setting to the fan controller 242. The fan controller 242 can then set different the fan speeds of the cooling fan 240 based on the measured inlet ambient temperatures.

If the identifier of the card 204 does not match any of the identifiers in the portfolio table, the controller 202 can proceed to the next thermal control method in the hierarchical process. In particular, the controller 202 can determine whether an industry cooling tier for the card 204 is located within a register of the card. If an industry cooling tier for the card 204 is stored within a register, the controller 202 can determine a fan speed control setting based on the cooling tier associated with the card within the portfolio table, and can provide the fan speed control setting to the fan controller 242. The fan controller 242 can then set different the fan speeds of the cooling fan 240 based on the measured inlet ambient temperatures.

If the controller 202 determines that the identifier of the card 204 does not match any of the thermal cooling methods, an unmatched response for the card is received at the controller. The controller 202 can then display a message to an individual of the information handling system 200 indicating that an unmatched card has been detected, and that an estimated fan speed has been determined and applied by the controller. The individual can then have the option to turn off the process of calculating an estimated fan speed for the card based on an estimated power consumption of the card 204 in response to an unmatched response so that the individual can to provide his or her own fan speed settings. In an embodiment, the individual can utilize the custom fan speed setting to increase fan speeds above levels set by a baseline cooling needs for the information handling system 200, but may not decrease the fan speed levels below the baseline cooling levels. The controller 202 can then provide the custom fan speed control setting to the fan controller 242. The fan controller 242 can set different the fan speeds of the cooling fan 240 based on the measured inlet ambient temperatures.

In an embodiment, if the individual does not turn off the process of calculating an estimated fan speed based on an estimated power consumption of the card 204, the controller 202 can determine a card lane width for the card. The controller 202 can then utilize the card lane width for the card 204 to determine the power consumption of the card. The controller 202 can also determine an energy balance calculation for the card 204 and the information handling system 200 based on the estimated power consumption of the card. The controller 202 can then calculate an estimated fan speed based on the energy balance calculation of the card 204, and can provide the estimated fan speed to the fan controller 242. In an embodiment, the controller 202 may also increase the estimated fan speed by a predetermined amount to create an updated estimated fan speed. In an embodiment, updated estimated fan speed with the added fan speed margin may provide a higher amount of cooling to the card 204 than just the estimated fan speed. The controller 202 can then provide either the estimated fan speed or the updated estimated fan speed to the fan controller 242, which in turn can set different fan speeds of the cooling fan 240 based on the measured inlet ambient temperatures.

Figure 4:
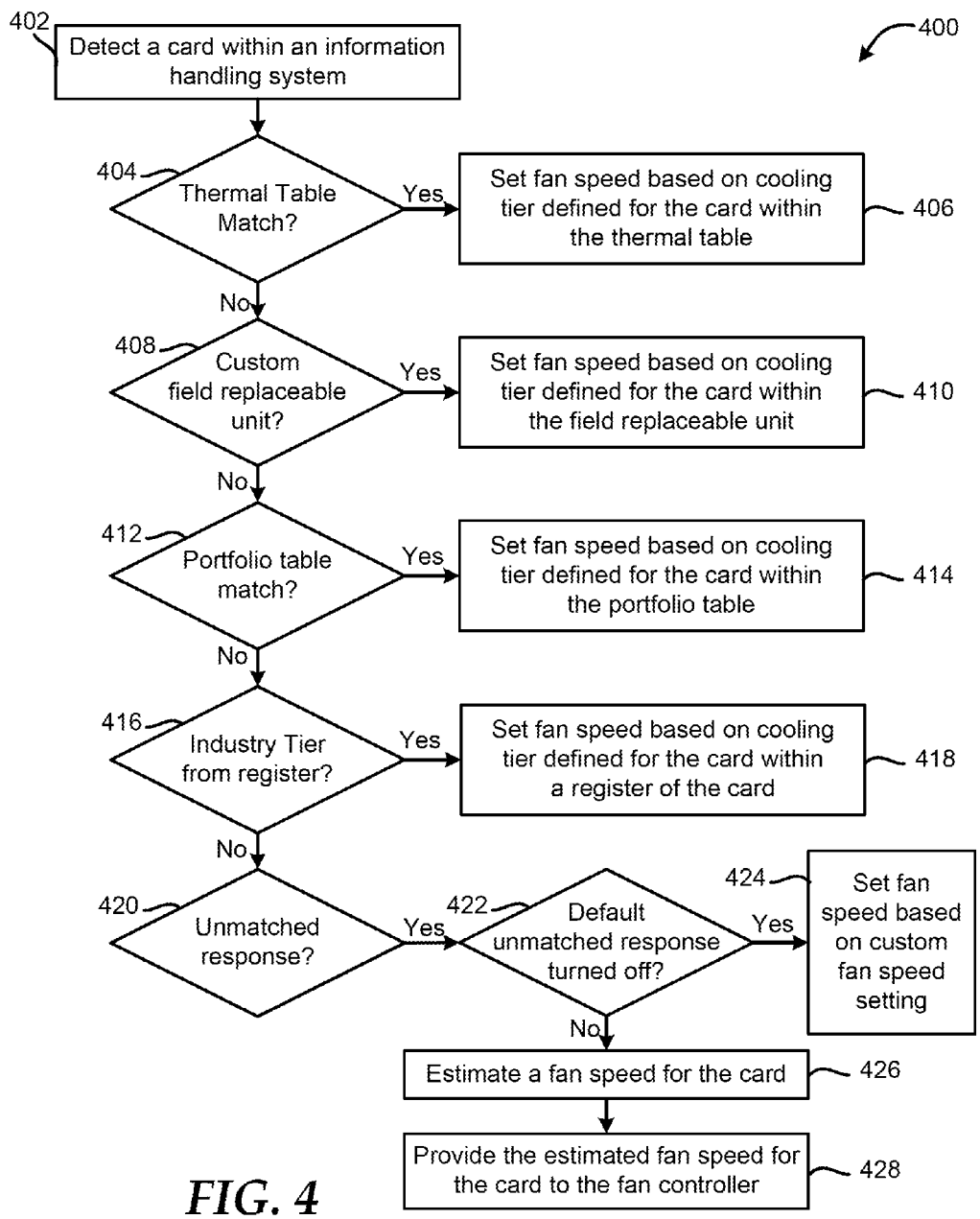
FIG. 4 is a flow diagram of a method for performing a hierarchical process to select a thermal cooling method for a card of the information handling system according to at least one embodiment of the present disclosure.

FIG. 4 illustrates a method 400 for performing a hierarchical process to select a thermal cooling method for a card of the information handling system according to at least one embodiment of the present disclosure. At block 402, a card is detected within the information handling system. In an embodiment, the card can be detected by a controller of the information handling system, such as a baseboard management controller, an embedded controller, or any similar controller that can enable communication to the information handling system including an integrated Dell Remote Access Controller (iDRAC). In an embodiment, the card can be a peripheral component interconnect express (PCIe) card or the like. At block 404, a determination is made whether an identifier of the card matches one of the identifiers found in a platform thermal table of the information handling system. The platform thermal table can be stored in a memory associated with the controller, such as a non-volatile memory of the controller. In an embodiment, the identifier can be a device identifier, a sub-device identifier, a vendor identifier, a sub-vendor identifier, or the like.

If the identifier of the card matches an identifier in the platform thermal table, a fan speed of a cooling fan is set based on a cooling tier that the identifier is associated with in the platform thermal table at block 406. In an embodiment, the platform thermal table can include 1 or more cooling tiers, such as tier 1, tier 2, tier 3, tier 4, and tier 5. In an embodiment, the platform thermal table can be stored in the firmware of the controller and can group different card identifiers into different cooling tiers based on a predefined cooling need for the card. In an embodiment, a particular cooling tier can increase the fan speed from a baseline fan speed by a predetermined amount based on the ambient temperature.

If the identifier of the card does not match an identifier in the platform thermal table, the controller determines whether the card includes a custom field replaceable unit (FRU) that includes a cooling tier for the card at block 408. In an embodiment, the FRU of the card can be stored in a local memory of the card and can be accessible by the controller. If the card includes a custom FRU, the fan speed is set based on the cooling tier defined in the FRU of the card at block 410, otherwise the flow continues at block 412. In an embodiment, the FRU of the card can also be utilized with respect to a closed loop thermal control. In this embodiment, a temperature from the detected card can be read by the controller, and the controller can alter the closed loop thermal control to maintain the temperature of the card to a target temperature defined in the FRU or other applicable table of the card.

At block 412, a determination is made whether the identifier of the card matches any of the identifiers in a portfolio table. In an embodiment, the portfolio table can be stored within a memory of the controller, in a memory of the information handling system that is accessible by the controller, or the like. In an embodiment, the portfolio table can include a device cooling tier field, which includes a cooling tier for the card. If the identifier for the card is located within the portfolio table, a fan speed of the cooling fan is set based on the cooling tier associated with the card within the portfolio table at block 414. Otherwise, the flow continues at block 416, and a determination is made whether an industry cooling tier for the device is located within a register of the card.

If an industry cooling tier for the device is stored within a register, the fan speed for the cooling fan is set based on the retrieved cooling tier at block 418. If an industry cooling tier for the device is not stored within a register, a determination is made that an unmatched response for the card is received at block 420. At block 422, a determination is made whether a default unmatched response is turned off. In an embodiment, an individual may want to control the cooling of the information handling system, such that the individual may turn off the unmatched response to prevent the controller from determining a fan speed in response to an unmatched card. If the unmatched response is turned off, the fan speed of the cooling fan is set based on a custom fan speed setting from the individual at block 424. In an embodiment, the individual can utilize the custom fan speed setting to increase fan speeds above levels set by a baseline cooling needs for the information handling system. In an embodiment, if the unmatched response is turned off, the fan speed of the cooling fan can set based on one of the previous thermal cooling methods, the custom fan speed setting, or the like.

If the unmatched response is not turned off, an estimated fan speed for the card is calculated at block 426. In an embodiment, the card lane width for the card can be utilized to estimate the fan speed for the card. In an embodiment, the estimated fan speed can be determined based on a power consumption of the card and an energy balance calculation for the card and the information handling system. At block 428, the fan speed of the cooling fan for the card is provided to a fan controller.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system comprising:
a fan controller to control a speed of a cooling fan; and
a controller configured to communicate with the fan controller, the controller to detect a presence of a card within the information handling system, to determine whether the card matches a first thermal control method of a plurality of thermal control methods, to utilize the first thermal control method to cool the card in response to the card matching the first thermal control method, otherwise determine whether the card matches a next in order thermal control method of the thermal control methods, wherein the first thermal control method is utilized by the controller to determine a cooling tier for the card based on the first thermal control method and to provide the fan controller with a speed of the cooling fan based on the cooling tier, to estimate a fan speed of the card in response to the card not matching any of the thermal control methods, and to provide the estimated fan speed to the fan controller.

2. The information handling system of claim 1, the controller further to match the card to one of the thermal control methods via a hierarchical process.

3. The information handling system of claim 1, wherein the thermal control methods include a platform thermal table, a card FRU, a portfolio table, and an unmatched response.

4. The information handling system of claim 1, wherein the controller determines that the card matches a thermal control method in response to an identification of the card is located within a table of the thermal control method.

5. The information handling system of claim 1, wherein the controller to estimate the fan speed further includes: the controller to detect a card lane width in response to the first thermal cooling method being the un-matched response, to estimate the fan speed of the card based on the card lane width.

6. The information handling system of claim 5, the fan controller to set cooling needs for the card based on energy balance calculations.

7. The information handling system of claim 1, the controller to remove an un-matched response from the thermal cooling methods in response to a request to turn off a fan response for the card.

8. The information handling system of claim 1, wherein the card is a peripheral component interconnect express card.

9. A method comprising:
detecting, at a controller, a presence of a card within an information handling system;
determining whether the card matches a first thermal control method of a plurality of thermal control methods;
utilizing the first thermal control method to cool the card in response to the card matching the first thermal control method, otherwise determining whether the card matches a next in order thermal control method of the thermal control methods, wherein the first thermal control method determines a cooling tier for the card based on the first thermal control method and provides the fan controller with a speed of the cooling fan based on the cooling tier;
detecting a card lane width in response to the first thermal cooling method being an un-matched response; and
estimating a fan speed of the card based on the card lane width.

10. The method of claim 9, further comprising:
matching the card to one of the thermal control methods via a hierarchical process.

11. The method of claim 9, wherein the thermal control methods include a platform thermal table, a card FRU, a portfolio table, and an unmatched response.

12. The method of claim 9, further comprising:
determining that the card matches a thermal control method in response to an identification of the card is located within a table of the thermal control method.

13. The method of claim 9, further comprising:
setting cooling needs for the card based on energy balance calculations.

14. The method of claim 9, further comprising:
removing an un-matched response from the thermal cooling methods in response to a request to turn off a fan response for the card.

15. The method of claim 9, wherein the card is a peripheral component interconnect express card.

16. A method comprising:
detecting, at a controller, a presence of a card within an information handling system;
determining whether the card matches a first thermal control method of a plurality of thermal control methods;
utilizing the first thermal control method to cool the card in response to the card matching the first thermal control method, otherwise determining whether the card matches a next in order thermal control method of the thermal control methods;
estimating, by the controller, a fan speed of the card in response to the card not matching any of the thermal control methods; and
providing, by the controller, the fan speed control setting of the card to a fan controller.

17. The method of claim 16, further comprising:
setting cooling needs for the card based on energy balance calculations.

18. The method of claim 16, further comprising:
removing an un-matched response from the thermal cooling methods in response to a request to turn off a fan response for the card.

19. The method of claim 16, wherein the card is a peripheral component interconnect express card.

* * * * *